United States Patent [19]

Ibok

[11] Patent Number: 5,712,196
[45] Date of Patent: Jan. 27, 1998

[54] METHOD FOR PRODUCING A LOW RESISTIVITY POLYCIDE

[75] Inventor: Effiong E. Ibok, Austin, Tex.

[73] Assignee: Advanced Micro Devices, Inc., Sunnyvale, Calif.

[21] Appl. No.: 674,081

[22] Filed: Jul. 1, 1996

Related U.S. Application Data

[63] Continuation of Ser. No. 473,195, Jun. 7, 1995, abandoned.
[51] Int. Cl.$^6$ .................................................. H01L 21/283
[52] U.S. Cl. .................. 437/200; 437/24; 437/40; 437/46; 437/93; 437/112; 437/141; 437/192; 437/228; 437/946; 437/968
[58] Field of Search ........................ 437/200, 228, 437/192, 946, 40, 112, 141, 240, 93, 24, 46, 968

[56] References Cited

U.S. PATENT DOCUMENTS

| | | | |
|---|---|---|---|
| 4,604,789 | 8/1986 | Bourassa | 29/576 |
| 4,900,257 | 2/1990 | Maeda | 437/200 |
| 5,027,185 | 6/1991 | Liauh | 357/59 |
| 5,286,668 | 2/1994 | Chou | 437/52 |

OTHER PUBLICATIONS

Wolf, "Silicon Processing For The VLSI Era", *Lattice Press*, (1986), pp. 301–303.

*Primary Examiner*—Thorl Chea
*Attorney, Agent, or Firm*—Kevin L. Daffer; Conley, Rose & Tayon

[57] ABSTRACT

A semiconductor fabrication technique is provided for producing a low resistivity polycide. Polycide resistivity is lowered by minimizing areas where the polycide is unduly thin. By preparing the polysilicon upper surface prior to polycide formation thereon, the polysilicon surface can grow polycide at a uniform rate across the entire polysilicon surface. The polysilicon surface is prepared by either restricting doping atoms at grain boundary locations at the polysilicon surface, or by disrupting the grain boundaries by ion implanting that surface. In either instance, a properly prepared polysilicon surface greatly enhances the conductivity of polycide grown thereon.

19 Claims, 4 Drawing Sheets

METHOD FOR PRODUCING A LOW RESISTIVITY POLYCIDE

This is a continuation of application Ser. No. 08/473,195 filed Jun. 7, 1995, now abandoned.

FIELD OF THE INVENTION

This invention relates to integrated circuit fabrication and more particularly to an improved method of forming a low resistivity polycide.

DESCRIPTION OF THE RELEVANT ART

Manufacture of an integrated circuit involves numerous processing steps. Each fabrication step may entail many variations, depending upon the specific structure being formed. The order in which the steps are performed is by no means fixed. In some instances, a wafer may be reintroduced through one or more similar processing steps to accomplish a completed wafer. The completed wafer thereby comprises numerous layers, beginning with implant (or diffusion) regions underlying conductive and insulative layers. Modern integrated circuits can involve more than one type of well region within a semiconductor substrate, and one or more metallization (or interconnect) layers overlying the substrate. As defined herein, "interconnect" refers to a conductive trace element extending across a portion of the wafer. Interconnect is used to complete the electrical connection between various implant regions formed within the wafer substrate. Interconnect can further be used to carry voltage to a gate conductor of an active device. A gate conductor of polycrystalline silicon (or polysilicon) materials is thereby classified as part of the interconnect structure arranged across a wafer topography.

Polysilicon used as a gate conductor of a metal oxide semiconductor (MOS) device is well known. A polysilicon layer can be selectively removed using conventional photolithography techniques, resulting in a patterned gate conductor overlying the gate oxide and channel region of a p-type or n-type MOS device. Source and drain regions are formed within the substrate on opposite sides of the polysilicon trace element using well known self-aligned processes. The polysilicon gate conductor serves not only to mask implant within the channel region during times in which the source and drain regions are formed but, more importantly serves as a conductive element which can be quickly and easily biased at the channel site. The polysilicon gate conductor must therefore be of relatively low resistivity, similar to the attributes of various other interconnect elements formed across the wafer. Unfortunately, polysilicon resistivity, in and of itself, does not compare favorably with other interconnect materials such as, for example, aluminum or aluminum silicide.

As the features of VLSI circuits continue to shrink, the necessity of decreasing the resistance and capacitance associated with the polysilicon gate conductor becomes even more pressing. A large resistance and capacitance product will result in a delay in the operating speed of an MOS device. The resistance and capacitance is probably best illustrated in reference to the following equation:

$$RC = R_s L^2 \epsilon_{ox}/X_{ox} \qquad \text{(eq. 1)},$$

where $R_s$ is the sheet resistance of the interconnect, L is the length of the interconnect, $X_{ox}$ is the dielectric thickness underlying the interconnect, and $\epsilon_{ox}$ is the permittivity of the underlying dielectric, such as silicon dioxide. In order to fabricate dense, high speed MOS devices, equation 1 illustrates the benefits in manufacturing the polysilicon gate conductor with as low a resistivity $R_s$ as possible.

One way in which to reduce the resistivity of the gate conductor is to substitute aluminum instead of polysilicon. Aluminum demonstrates a resistivity considerably lower than polysilicon. Unfortunately, replacement of polysilicon is an impossibility if subsequent processing steps involve temperature cycles greater than approximately 500° C. Processing temperature exceeding 500° C. will melt the aluminum gate structure, rendering it useless as a channel activation element. Aluminum is thereby used only at the latter stages of integrated circuit fabrication (i.e., after the high temperature cycles such as impurity drive-in and anneal) are completed. While aluminum or aluminum silicide remains a mainstay as junction (source/drain junction) interconnect, it generally cannot be used at the early stages of fabrication—i.e., as the gate conductor of an MOS device.

Although aluminum, or aluminum silicide, appears infeasible as a gate conductor material, polysilicon alone may not be adequate as the gate conductor material if used in a high speed device. Resistivity of polysilicon, regardless of the doping level of the polysilicon is generally quite high. In many instances, a gate conductor consisting only of polysilicon effectuates an impermissible high resistivity ($R_s$) and the delay problems associated therewith. For that reason, pure polysilicon gate conductors have given away to what is often termed a "polycide" structure. A polycide structure is one having a refractory metal silicide formed at the upper surface of a bulk polysilicon trace conductor. A polycide is formed by depositing a refractory metal, such as Ti, W, Mo, etc., across the polysilicon upper surface. The metal-deposited polysilicon is then heated to intermingle the atomic structure at the juncture between the polysilicon and overlying metal. After sufficient intermingling has occurred, a polycide (e.g., $WSi_2$, $TiSi_2$, etc.) is formed. The unreacted or non-intermingled metal portion is then removed leaving only the polycide (reacted portion) at the upper surface of the polysilicon.

The polycide structure at the upper surface of polysilicon can reduce resistivity of the gate conductor. In instances where titanium is used as the refractory metal, the resulting polycide can produce a resistivity of approximately 15 micro ohms-cm. This measurement, however, is performed only across the polycide, and assumes an idealized polycide structure. That is, the polycide must be of uniform thickness. Achieving uniform thickness is difficult at best.

Formation of an optimal polycide structure assumes that the polycide grows evenly across the silicon source layer—in this case, across the polysilicon source layer. If the silicon (or polysilicon) upper surface is not adequately prepared, or if the reaction temperature is not optimally controlled, the resulting silicide (or polycide) can be far less than ideal. As an example, if the polysilicon structure includes one or more large peaks or valleys, the overlying metal atoms may show a propensity to react or intermingle at the valley regions as opposed to the peak regions. The resulting polycide may therefore be quite thin in regions overlying the peak areas. Another, more fundamental concern, deals with the overall structure of polysilicon. Due to grain boundaries within the polysilicon, and diffusion of impurities within those boundaries, there is a likelihood that a predominance of impurities at grain boundary locations could hinder polycide growth immediately over those boundaries. The polysilicon grain structure and pre-disposed impurities within the structure may thereby add to a less than optimal polycide structure. Any thinning effect resulting from polycide formation can thereby produce areas of high resistivity and the deleterious effects thereof.

SUMMARY OF THE INVENTION

The problems outlined above are in large part solved by the improved polycide process of the present invention. That is, the present polycide process utilizes a step which "prepares" the polysilicon upper surface prior to refractory metal deposition. Namely, the silicon atoms within the polysilicon upper surface are rearranged by the present process such that they are more optimally disposed to provide uniform polycide growth across the entire upper surface. One way in which to prepare the polysilicon upper surface is through ion implantation. Injection of ions into the polysilicon upper surface causes a rearrangement of the polysilicon grain structure. More importantly, ion injection causes bifurcation or breakage of grains at the polysilicon upper surface. Instead of having large grains and fewer grain boundaries, the upper surface is prepared such that smaller grains and larger numbers of grain boundaries are formed. In essence, ion injection or implantation amorphizes a relatively thin layer at the upper surface of the polysilicon. The amorphized layer includes many small grain structures which are evenly distributed across the polysilicon surface. The advantages of ion implantation (amorphizing) assure careful control of the resulting structure and allows in situ modification of the surface.

Polysilicon prepared in accordance with an ion implantation technique produces a more optimal surface upon which deposited metal can more evenly grow as polycide. A smooth, fine-grained polysilicon layer provides a more even rate of growth or intermingling between silicon atoms and metal atoms brought proximate to each other. According to an alternative embodiment, ion implantation can be avoided as a polysilicon surface preparation step. According to this embodiment, a stacked polysilicon structure is used, wherein an oxide layer is interposed between an underlying, doped polysilicon layer and an overlying, undoped polysilicon layer. The undoped polysilicon layer is deposited at temperatures which produce a fine grain structure. The intermediate oxide layer prevents or substantially minimizes migration of dopant atoms from the underlying polysilicon to the overlying polysilicon. Thus, the overlying polysilicon remains substantially free of dopants, and the negative effects of intergrain dopant atoms upon the growth of overlying polycide. As will be described hereinbelow, and without being bound to theory, it is postulated that the combination of grain boundaries and predominance of dopants within those boundaries cause localized thinning of overlying polycide. Minimizing grain size and maximizing grain boundaries produces a more uniform thinning across the entire polycide structure. Additionally, minimizing the presence of dopant at the upper surface appears to achieve almost the same result. That is, excluding dopant atoms from the upper surface will minimize their migratory action to grain boundary sites and the negative impact on polycide thinning at those sites. Complete elimination of dopants, however, is not feasible since the polysilicon structure demands electrical activation via the presence of dopants. However, by presenting a unique gate conductor of doped polysilicon and undoped polysilicon separated by an oxide barrier, the benefits of polysilicon electrical activation is combined with the benefits of uniform polycide growth.

Broadly speaking, the present invention contemplates a method for producing a low resistivity polycide. The method comprises the steps of depositing a layer of polysilicon upon one surface of a silicon substrate. The layer of polysilicon is then doped with a first impurity species, and thereafter select portions of the doped layer of polysilicon are removed to present a polysilicon gate structure. The upper surface of the polysilicon gate structure (or gate conductor) is then prepared such that smaller grains are formed at the upper surface. Preparation includes ion implanting the upper surface of the polysilicon gate with an ion species such as phosphorous, argon or silicon. Once prepared, the polysilicon upper surface then receives a silicide, generally referred to as a polycide.

According to an alternative embodiment, a low resistivity polycide structure is formed upon a second, upper layer of polysilicon. The second polysilicon is deposited upon an oxide, wherein the oxide overlays a first layer of polysilicon. The second layer of polysilicon does not receive doping impurities and is protected from migration of dopants from the doped first layer of polysilicon via the oxide. Accordingly, the oxide serves as a dopant migration barrier. The absence of dopant at the second layer of polysilicon allows for a more uniform growth of silicide formed thereon. Accordingly, the present invention contemplates a method of preparing a polysilicon layer, either by controlling dopant species within the polysilicon, breaking the grain structure at the polysilicon upper surface, or a combination of both. An adequately prepared polysilicon surface provides a polycide resistivity of, for example, 12 micro ohms-cm. using a titanium refractory metal. Suitably, an upper surface layer of approximately 0.1 µm can be prepared as having smaller grain structures through use of an ion implantation technique. Ion implantation and/or dopant control at the polysilicon upper surface presents an optimally prepared polysilicon surface upon which a more uniform thickness of polycide can form.

BRIEF DESCRIPTION OF THE DRAWINGS

Other objects and advantages of the invention will become apparent upon reading the following detailed description and upon reference to the accompanying drawings in which.

Figure 1:
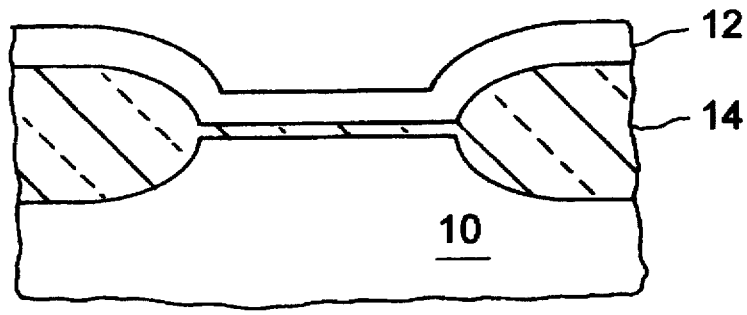
FIG. 1 is a partial cross-sectional view of a semiconductor substrate having a layer of polysilicon deposited upon and between field oxide regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a partial cross-sectional view of the semiconductor substrate 10 having a layer of polysilicon 12 deposited upon and between field oxide regions 14. Substrate 10 comprises a silicon-based substrate, generally grown as a single crystal silicon grown from, for example, the Czochralski process. Field oxide regions 14 are defined from the selective oxidation process, often referred to as local oxidation of silicon (or "LOCOS") process. Field oxide 14 can be grown from either dry oxygen or a steam ambient, depending upon process constraints. Moreover, field oxide 14 can form from a non-recessed, semi-recessed or full recessed LOCOS process. Field oxide 14 is grown to a thickness necessary to prevent inversion and channel formation underneath the field oxide by virtue of voltages placed upon overlying interconnect. Polysilicon 12 is preferably deposited from a chemical vapor deposition (CVD) chamber. The chamber can be an atmospheric or low pressure CVD chamber, either of which utilizes a silicon source such as silane. Polysilicon 12 is preferably formed in a CVD chamber heated to a temperature less than 650° C. and, in many instances, less than 550° C. The reaction process is sustained for a period necessary to form a thickness in the range of 3,000 Angstroms to 5,000 Angstroms, and preferably near 4,000 Angstroms.

Figure 2:
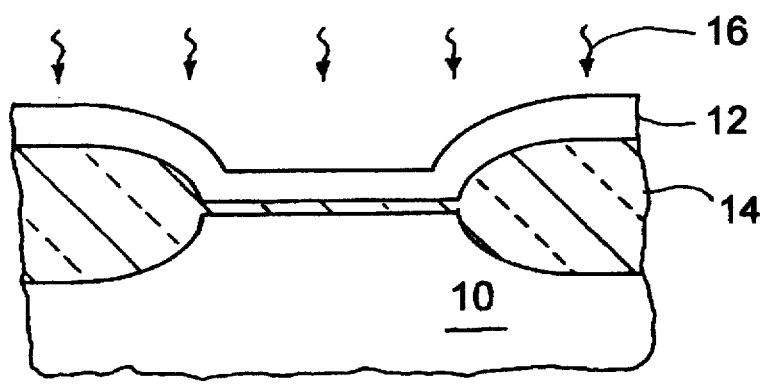
FIG. 2 is a partial cross-sectional view of the semiconductor substrate of FIG. 1 undergoing doping of the layer of polysilicon.

FIG. 2 illustrates a processing step subsequent to that shown in FIG. 1. Specifically, FIG. 2 depicts a doping process, wherein ions 16 are diffused into polysilicon 12. Polysilicon 12, comprising a layer extending across the entire wafer surface, is adapted to receive at its exposed surface a relatively heavy concentration of "phosphorous ions." Preferably phosphorous is diffused into polysilicon 12 via a diffusion furnace, wherein diffusion takes place from a POCl$_3$ source. "Phosphorous doping" is preferably carried out at a heavy concentration generally in the range of $6 \times 10^{20}$ atoms/cm$^3$. A heavy concentration of phosphorous atoms inserted into polysilicon 12, coupled with subsequent drive-in, ensures a uniform concentration throughout the cross-sectional profile of polysilicon 12. It is important that the entire cross-section receive the impurity concentration to maximize the electrically active cross-sectional surface. A maximum cross-sectional surface of electrically active species will desirably minimize the resistivity of polysilicon 12.

Figure 3:
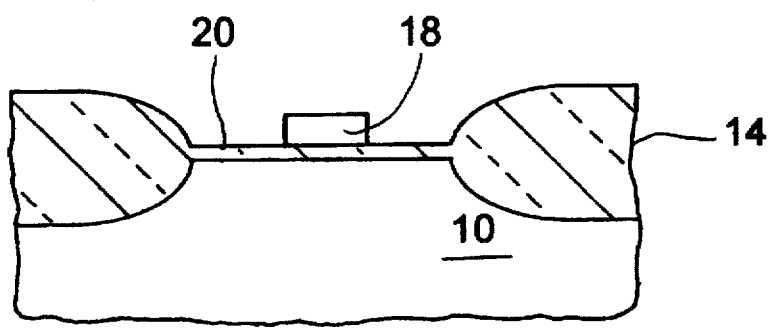
FIG. 3 is a partial cross-sectional view of the semiconductor substrate of FIG. 2 having a gate structure patterned from the layer of doped polysilicon.

FIG. 3 illustrates a processing step subsequent to that shown in FIG. 2. Specifically, polysilicon 12 is illustrated as having been patterned to present a polysilicon gate structure (or conductor) 18. Structure 18 is patterned from the layer of polysilicon 12 using various photolithography techniques. Structure 18 thereby resides over a relatively thin oxide 20. Oxide 20 is generally referred to as a gate oxide or tunnel oxide, depending upon its application. Oxide 20 is grown after cessation of the LOCOS process, and is generally of a thickness ranging between 50 Angstroms and 200 Angstroms, for example. During the patterning process, there may be instances in which the etchant used to form structure 18 reacts with the upper surface of structure 18 causing an unevenness at the upper surface of that structure. For example, the etchant material may cause pitting of the upper surface if not carefully controlled.

Figure 4:
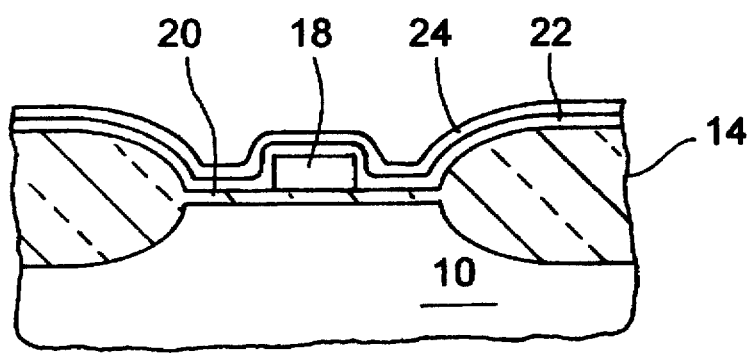
FIG. 4 is a partial cross-sectional view of the semiconductor substrate of FIG. 3 with thermally grown and deposited oxides formed upon the gate structure.

FIG. 4 illustrates a processing step subsequent to that of FIG. 3. A thermally grown oxide 22 is shown formed across field oxide 14 as well as gate structure 18. Oxide 22 has an advantage in that it consumes a portion of the polysilicon 18 upper surface. During the thermal growth (or consumption) process, various bond disruptions, often called "dangling bonds", are populated with atomic oxygen derived from oxide 22. Oxide 22 thereby forms a highly conformal layer across polysilicon gate structure 18 as well as field oxide regions 14. The conformal oxide easily lends itself to deposition of oxide 24 upon the exposed surface thereof.

Figure 5:
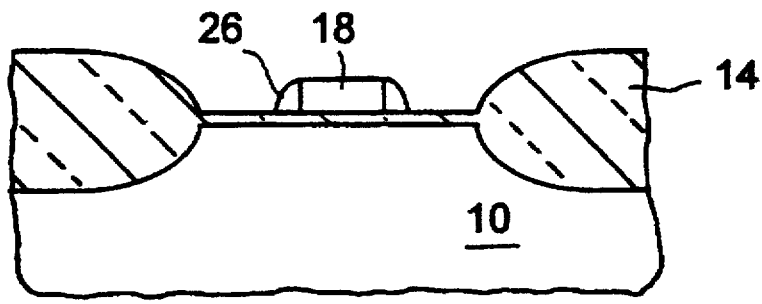
FIG. 5 is a partial cross-sectional view of the semiconductor substrate of FIG. 4 with sidewall spacers patterned from the grown and deposited oxides.

Referring to FIG. 5, a processing step subsequent to FIG. 4 is shown. FIG. 5 illustrates the step after which portions of oxides 22 and 24 are removed. After those portions are removed, a sidewall spacer 26 is presented at the side or lateral surfaces of polysilicon gate structure 18. Sidewall spacer 26 is used to reduce what is often called hot carrier effects and to prevent silicide shorting by eliminating silicidation thereon. Accordingly, sidewall spacer 26 is used in the well known lightly doped drain (or "LDD") process. Spacers 26 are present to allow formation of a lightly doped region near the channel area, and more heavily doped regions further from the channel area. Not shown simply for the sake of brevity are those lightly doped regions which are formed in the source and drain regions prior to formation of spacer 26. After spacer 26 is formed, more heavily doped regions are placed using spacer 26 as a masking material. It is important to note, however, that use of spacer 26 is merely an advantage in VLSI processes which are more susceptible to short channel effects. If desired, spacer 26 and the formation thereof can be avoided for lesser density processes without departing from the spirit and scope of the present invention. Accordingly, it is not necessary that spacer 26 be used as a critical step in preparing the upper surface of the polysilicon gate structure. Thus, it is not necessary that steps forming the spacer be employed as critical steps in carrying out the polysilicon preparation process. Conformal oxide 22 may, however, enhance polysilicon 18 upper surface and thereby would not detrimentally effect the spirit and purpose of the present invention.

Figure 6:
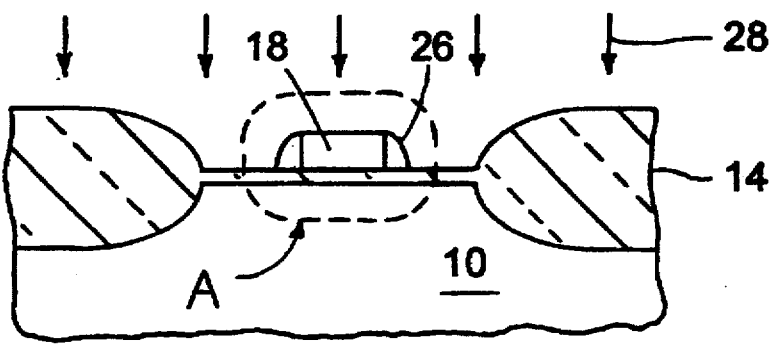
FIG. 6 is a partial cross-sectional view of the semiconductor substrate of FIG. 5 undergoing ion implantation.

Referring now to FIG. 6, a processing step subsequent to that of FIG. 5 is shown. Namely, species of ions 28 are implanted onto the exposed surfaces of the resulting wafer topography. The ions can be chosen from a group which consists of neutral ions, silicon ions or proper portions of electrically active ions. For example, "argon ions, silicon ions or phosphorous ions" can be used. The phosphorous ions would add to the contingent of ions normally residing within the source/drain regions of, for example, an NMOS active device. Field oxide 14 and polysilicon gate structure 18 prevent passage of ions through the respective structures to underlying silicon regions. Thus, even if the chosen ions are electrically active ions, their presence would not reside in substrate areas where channels are not to be formed. More importantly, ions 28 impact with the upper surface grain structure of polysilicon 18. An implant energy is chosen which allows the impacting ions to disrupt the grain structure from its pre-existing condition to a more amorphized pattern.

Preparation of polysilicon gate structure 18 upper surface using ion implantation provides smaller grains within the polycrystalline silicon material. The smaller grains (and larger numbers of grain boundaries) provide, according to the present purpose, a lower resistivity silicide subsequently formed on the upper surface of polysilicon gate structure 18. Ion implantation is one method in which to prepare that upper surface, regardless of whether or not a conformal oxide and an associated sidewall spacer are used.

Figure 7:
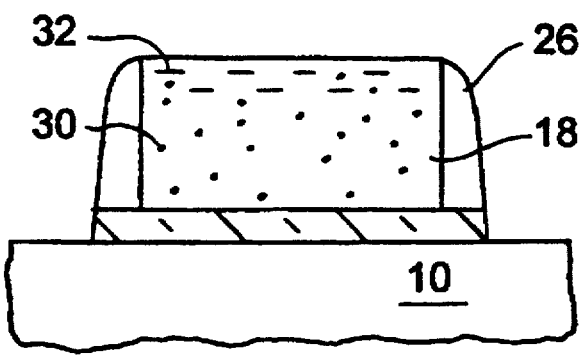
FIG. 7 is a partial cross-sectional view of the semiconductor substrate along plane A of FIG. 6, depicting relative locations of impurity concentrations within the gate structure.

FIG. 7 illustrates a detailed view along plane A of FIG. 6. The detailed view depicts, in relative terms, the dopant locations within polysilicon gate structure 18. Dopant ions 16, implanted according to FIG. 2, are presented in a somewhat uniform fashion across the cross-sectional area of polysilicon gate structure 18. Conversely, the atoms resulting from implanted ions 28 reside primarily at the upper surface of polysilicon gate structure 18. Atomic structure resulting from dopant ions 16 are illustrated with reference numeral 30, and atomic structure resulting from implanted ions 28 are designated with reference numeral 32.

Figure 8:
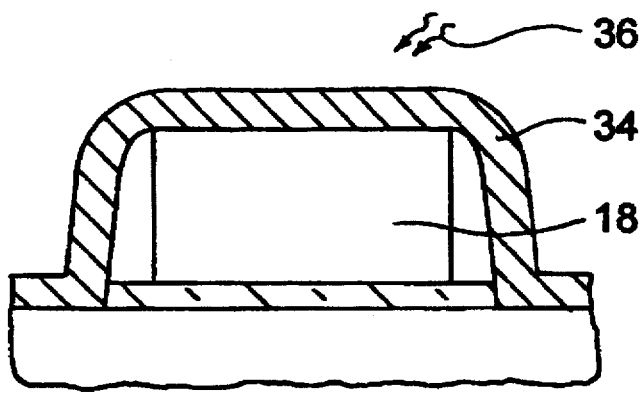
FIG. 8 is a partial cross-sectional view of the semiconductor substrate of FIG. 7 having a layer of refractory metal deposited upon the gate structure.
Figure 9:
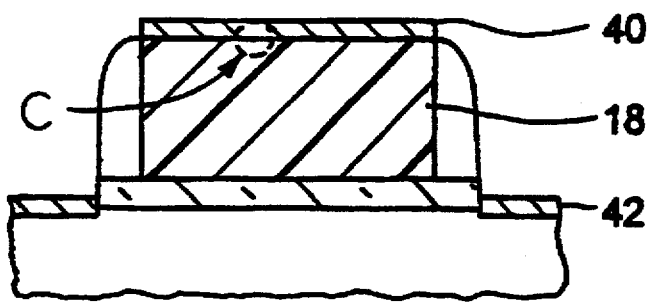
FIG. 9 is a partial cross-sectional view of the semiconductor substrate of FIG. 8 after reacted metal (polycide and silicide) is retained and unreacted metal is removed.

Referring now to FIG. 8, a processing step subsequent to that of FIG. 7 is shown. FIG. 8 depicts a layer of refractory metal 34 deposited across the upper wafer topography, including polysilicon gate structure 18 upper surface. Refractory metal 34 includes any metal material classified as a refractory-type metal, including Ti, Ta, W or Mo. After metal layer 34 is deposited, an anneal step is performed by heating the wafer as indicated by thermal convection arrows 36. Application of heat causes reaction between metal layer 34 and polysilicon 18. Metal layer 34 is preferably deposited using various well known techniques, such as sputter deposition or chemical vapor deposition. Reaction between metal layer 34 and polysilicon 18 produces a silicon-rich phase as the polycide begins to grow. Growth of polycide consumes a portion of the upper surface of polysilicon 18, whereas growth of the silicide consumes a portion of the upper surface of silicon substrate 10. FIG. 9 illustrates resulting polycide region 40 and silicide region 42 formed from direct metallurgical action at the heated polysilicon/metal juncture. Polycide 40 and silicide 42 remain after the unreacted portions of metal layer are removed.

Figure 10:
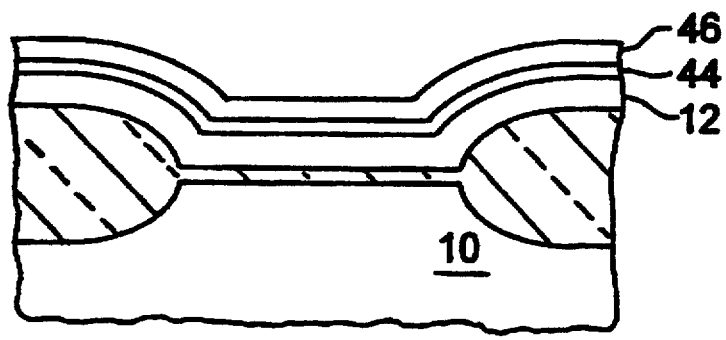
FIG. 10 is a partial cross-sectional view of the semiconductor substrate of FIG. 2, according to an alternative embodiment, prepared with an oxide and second layer of polysilicon formed upon a first layer of polysilicon.

FIG. 10 illustrates formation of a polysilicon gate structure according to an alternative embodiment. Specifically, FIG. 10 depicts a fabrication step subsequent to that of FIG. 2. Polysilicon layer 12 is adapted to receive a relatively thin (e.g., less than 100 Angstroms) layer of silicon dioxide upon its upper surface. The silicon dioxide 44 is preferably grown, however, it can be deposited using conventional chemical vapor deposition techniques. Deposited at the upper surface of oxide 44 is a second layer of polysilicon 46. First layer polysilicon 12, oxide 44 and second layer polysilicon 46 form a tri-layer structure across the entire wafer surface.

Figure 11:
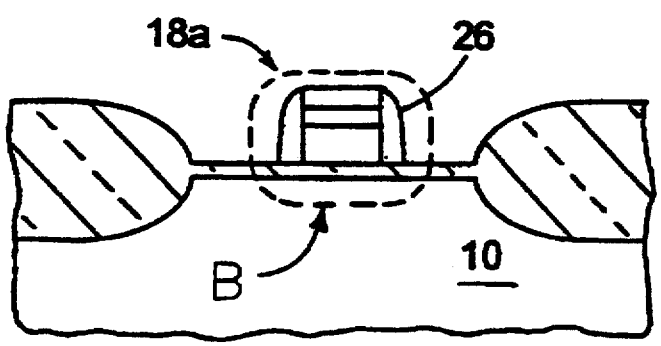
FIG. 11 is a partial cross-sectional view of the semiconductor substrate of FIG. 10 having a gate structure patterned from a stacked polysilicon structure.

FIG. 11 illustrates a processing step subsequent to that of FIG. 10. The tri-layer structure is patterned, leaving a polysilicon gate structure (or conductor) 18a. Gate structure 18a of FIG. 11 is shown having sidewall spacers 26, similar to the configuration shown in FIG. 5. Sidewall spacers 26 are formed using various etch-back techniques, leaving an exposed upper surface of gate structure 18a.

Figure 12:
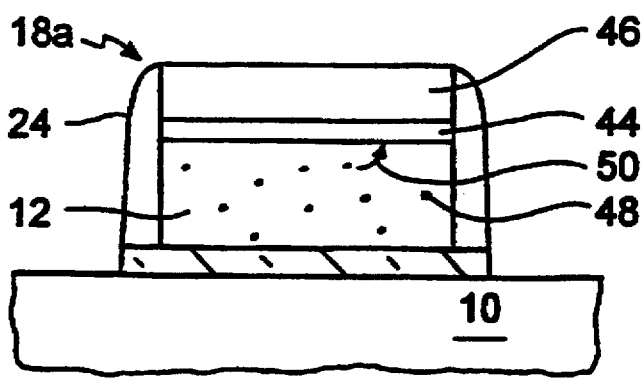
FIG. 12 is a partial cross-sectional view of the semiconductor substrate along plane B of FIG. 11, depicting relative locations of impurity concentrations within the gate structure.

FIG. 12 illustrates the relative locations of atomic structures provided within gate structure 18a. Atomic structures 48 are present throughout the first layer of polysilicon 12 of gate structure 18a. Oxide 44 suffices as a barrier against migration of those dopants 48 into overlying polysilicon layer 46. FIG. 12 represents a detailed view along plane B of FIG. 11, and presents an indication of where, relatively speaking, atomic dopants 48, brought about by the step of FIG. 2, reside within the first polysilicon layer 12. It is appreciated from FIG. 12 that the upper surface of gate structure 18a can be substantially void of dopant, and the problems of impurity accumulation within grain boundary areas at the upper surface of second polysilicon layer 46. As shown by arrow 50, oxide 44 serves as a barrier to prevent migration of impurities pre-existing within layer 12 to layer 46. Dopant 48 within layer 12 serves to enhance conductivity of the overall structure 18a but not at the expense of jeopardizing the integrity of layer 46 upper surface. Thus, layer 46 upper surface has substantially lower concentrations of dopant 48 than layer 12.

Figure 13:
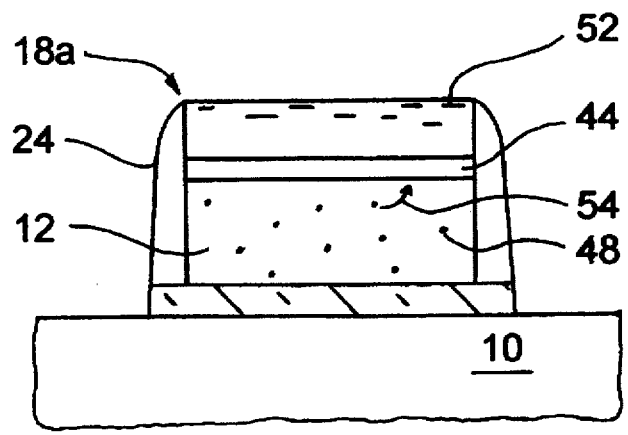
FIG. 13 is a partial cross-sectional view of the semiconductor substrate along plane B of FIG. 12, depicting relative locations of impurity concentrations within the gate structures after having undergone ion implantation of the second layer of polysilicon.

FIG. 13 illustrates, according to an alternative methodology, implantation of species 52 within second polysilicon layer 46 subsequent to the step of FIG. 12. Implant is carried out using ion implantation techniques, whereby sufficient energy and dosage is imparted to the implanting species to cause disruption of the grain structure. The resulting grain structure therefore comprises more grains of smaller size than the grains present prior to ion implantation. FIGS. 12 and 13 illustrate alternative embodiments of gate conductor 18a having no ion implantation and ion implantation, respectively. In either instance, the tri-layer gate structure 18a is adequately prepared for subsequent growth of polycide at its upper surface. Barrier oxide 44 in FIG. 13 provides the same advantages as that shown in FIG. 12, in that dopants 48 within polysilicon 12 are prevented from migrating to second polysilicon layer 46.

Figure 14:
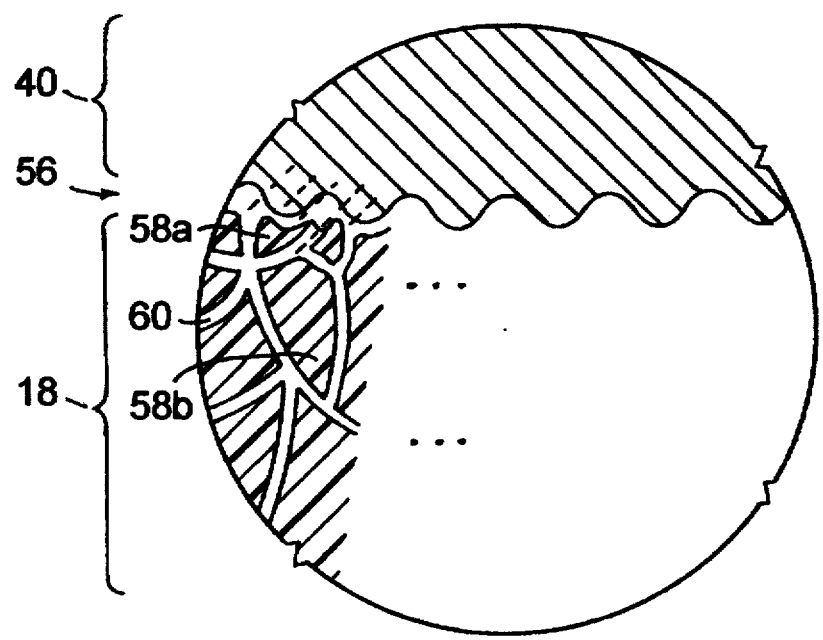
FIG. 14 illustrates a detailed view along area C of FIG. 9 to indicate a geometric disparity on the upper surface grain structure relative to the lower (or bulk) grain structure.

FIG. 14 illustrates a detailed view along area C of FIG. 9. Polycide 40 is shown intermixed within the polysilicon of gate structure 18 at juncture 56. FIG. 14 is provided only for the sake of explanation, and is not indicative of the actual structural features at juncture 56. FIG. 14 is only provided to indicate a geometric disparity at the upper surface grain structure relative to the lower (or bulk) grain structure. Specifically, the upper surface of gate structure 18 includes grains 58a of smaller dimension than grains 58b within the bulk. Accordingly, there are more grain boundaries 60 at the upper surface than within the bulk. An enhanced number of grain boundaries cause a more uniform gradient of reaction sites at juncture 56. A larger number of reaction sites spread more uniformly over structure 18 upper surface causes a corresponding uniformity in the growth of polycide 40. Polycide 40 therefore can be formed at a more even thickness with fewer numbers of large disparities in thickness.

It will be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art. Any modification necessary to prepare the upper surface of polysilicon for obtaining a more uniform growth rate of polycide thereon falls within the spirit and scope of the present invention. Preparation techniques include not only the restriction of impurity atoms at the polysilicon upper surface, but also ion implantation of that surface. It is intended that the following claims be interpreted to embrace all such modifications and changes and, accordingly, specifications and drawings are to be regarded in an illustrative rather than a restrictive sense.

What is claimed is:

1. A method for producing a low resistivity polycide, comprising:

depositing a layer of polysilicon upon one surface of a silicon substrate;

doping said layer of polysilicon with a first impurity species to form a doped layer of polysilicon;

removing select portions of said doped layer of polysilicon to present a polysilicon gate structure having an upper surface;

implanting said upper surface with ions at an energy level sufficient to amorphize the upper surface of said polysilicon gate structure; and forming a silicide upon the amorphized upper surface of said polysilicon gate structure.

2. The method as recited in claim 1, wherein said depositing comprises chemical vapor depositing polysilicon from a silane source.

3. The method as recited in claim 1, wherein said doping comprises placing said layer of polysilicon in a heated diffusion chamber containing atoms of the first impurity species.

4. The method as recited in claim 1, wherein said doping said layer of polysilicon with a first impurity species is to a concentration level of $1 \times 10^{19}$ to $1 \times 10^{21}$ atoms/cm$^3$.

5. The method as recited in claim 1, wherein said removing comprises anisotropically etching the doped layer of polysilicon.

6. The method as recited in claim 1, wherein said amorphizing comprises implanting ions of a second impurity species to a concentration level less than said first impurity species.

7. The method as recited in claim 6, wherein said implanting step comprises injecting ions into the upper surface of said polysilicon gate structure to a concentration peak density less than 0.1 µm below said upper surface.

8. The method as recited in claim 1, wherein said forming step comprises:

depositing a refractory metal upon the upper surface of said polysilicon; and heating the deposited refractory metal to cause portions of the refractory metal to react with the upper surface of said polysilicon, and leaving non-reacted portions of the deposited refractory metal; and removing the non-reacted portions, of the deposited refractory metal.

9. The method as recited in claim 1, wherein the silicide in combination with the polysilicon gate structure form a polycide having a resistivity less than 90 µΩ-cm.

10. A method for producing low resistivity polycide, comprising:

depositing a first layer of polysilicon upon one surface of a silicon substrate;

doping said first layer of polysilicon with a first impurity species;

growing an oxide to form a grown oxide upon the first layer of polysilicon;

depositing a second layer of undoped polysilicon upon the grown oxide to form a stacked polysilicon structure;

removing select portions of said first and second layers of polysilicon; and forming a silicide upon an upper surface of the remaining said second layer of polysilicon.

11. The method as recited in claim 10, wherein said depositing a first layer and said depositing a second layer each comprise chemical vapor depositing respective first and second layers of polysilicon from a silane source.

12. The method as recited in claim 10, wherein said doping comprises placing said first layer of polysilicon in a heated diffusion chamber containing atoms of the first impurity species.

13. The method as recited in claim 10, wherein said doping said layer of polysilicon with a first impurity species is to a concentration level of $1 \times 10^{19}$ to $1 \times 10^{21}$ atoms/cm$^3$.

14. The method as recited in claim 10, wherein said removing comprises anisotropically etching said first layer of polysilicon, said layer of oxide and said second layer of polysilicon using a single lithography masking step.

15. The method as recited in claim 10, wherein said forming comprises:

depositing a refractory metal upon the upper surface of the remaining said second layer of polysilicon; and heating the deposited refractory metal to cause portions of the refractory metal to react with the upper surface of said second layer of polysilicon; and removing the non-reacted portions of the deposited refractory metal.

16. The method as recited in claim 10, further comprising amorphizing the upper surface of said second layer of polysilicon after said removing and before said forming.

17. The method as recited in claim 10, further comprising ion implanting the upper surface of said second layer with ion beam energy sufficient to displace, within 0.1 µm of the upper surface of said second layer, an amount of atoms per unit volume therein which is more than half the atomic density of total atoms therein.

18. The method as recited in claim 10, further comprising ion implanting the upper surface of said second layer with ion beam energy sufficient to displace, within 0.1 µm of the upper surface of said second layer, an amount of atoms per unit volume therein which approaches the atomic density of total atoms therein.

19. A method for producing a polycide having a resistivity of less than 12 µΩ-cm, comprising:

depositing a first layer of polysilicon upon one surface of a silicon substrate;

doping said first layer of polysilicon with a first impurity species;

growing an oxide to form a grown oxide upon the first layer of polysilicon;

depositing a second layer of polysilicon having an upper surface upon the grown oxide to form a stacked polysilicon structure;

removing select portions of said first and second layers of polysilicon to form respective remaining first and second layers of polysilicon, wherein the remaining second layer has an upper surface;

implanting ions into the upper surface of said second layer with ion beam energy sufficient to displace, within 0.1 μm of the upper surface of said second layer, an amount of atoms per unit volume therein which is more than half the atomic density of total atoms therein;

depositing a layer of titanium upon the upper surface of the remaining second layer of polysilicon;

heating the layer of titanium to cause portions of the titanium to react with the upper surface of said second layer of polysilicon, leaving non-reacted portions of the deposited titanium; and removing the non-reacted portions of the deposited titanium.

* * * * *

UNITED STATES PATENT AND TRADEMARK OFFICE
CERTIFICATE OF CORRECTION

PATENT NO. : 5,712,196
DATED : January 27, 1998
INVENTOR(S) : Effiong E. Ibok

It is certified that error appears in the above-identified patent and that said Letters Patent is hereby corrected as shown below:

Claim 8, col. 9, line 59, please delete --,-- after portions.

Signed and Sealed this

Twenty-first Day of April, 1998

Attest:

BRUCE LEHMAN

*Attesting Officer*  *Commissioner of Patents and Trademarks*